(12) United States Patent
Karpov et al.

(10) Patent No.: US 12,733,479 B2
(45) Date of Patent: Sep. 8, 2026

(54) INTEGRATED CIRCUIT (IC) DEVICE WITH MULTILAYER METAL LINE

(71) Applicant: Intel Corporation, Santa Clara, CA (US)

(72) Inventors: Ilya V. Karpov, Portland, OR (US); Shafaat Ahmed, Albuquerque, NM (US); Matthew V. Metz, Portland, OR (US); Darren Anthony Denardis, Albuquerque, NM (US); Nafees Aminul Kabir, Hillsboro, OR (US); Tristan A. Tronic, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 17/935,999

(22) Filed: Sep. 28, 2022

(65) Prior Publication Data

US 2024/0105588 A1 Mar. 28, 2024

(51) Int. Cl.
*H10W 20/42* (2026.01)
*H10W 20/00* (2026.01)
*H10W 20/41* (2026.01)

(52) U.S. Cl.
CPC ......... *H10W 20/42* (2026.01); *H10W 20/056* (2026.01); *H10W 20/077* (2026.01); *H10W 20/425* (2026.01); *H10W 20/435* (2026.01)

(58) Field of Classification Search
CPC ............. H01L 23/5226; H01L 23/5283; H01L 23/53223; H01L 21/76834; H01L 21/76877; H01L 21/76852; H01L 21/76885; H10W 20/42; H10W 20/056; H10W 20/077; H10W 20/425; H10W 20/435; H10W 20/0633; H10W 20/039; H10W 20/063
See application file for complete search history.

(56) References Cited

U.S. PATENT DOCUMENTS 12,224,237 B2 * 2/2025 Chang ............... H01L 21/31144
2021/0098366 A1 * 4/2021 Chang ............... H01L 23/53266

OTHER PUBLICATIONS

Mecklenburg, Matthew et al "Visualizing the Electron Wind Force in the Elastic Regime", https://doi.org/10.1021/acs.nanolett.1c02641, 6 pages downloaded Dec. 17, 2021.

(Continued)

*Primary Examiner* — Calvin Y Choi
(74) *Attorney, Agent, or Firm* — Akona IP PC

(57) ABSTRACT

An IC device includes a multilayer metal line that is at least partially surrounded by one or more electrical insulators. The multilayer metal line may be formed by stacking four layers on top of one another. The four layers may include a first layer between a second layer and a third layer. The first layer may include Al. The second or third layer may include W. The fourth layer may be a conductive or dielectric layer. The second layer, third layer, and fourth layer can protect the first layer from defects in Al core layer during fabrication or operation of the multilayer metal line. Substrative etch may be performed on the stack of the four layers to form openings. An electrical insulator may be deposited into to the openings to form multiple metal lines that are separated by the electrical insulator. A via may be formed over the third layer.

19 Claims, 16 Drawing Sheets

(56) References Cited

OTHER PUBLICATIONS

Tao, Jiang et al "Comparison of Electromigration Reliability of Tungsten and Aluminum Vias Under DC and Time-Varying Current Stressing", 30th Annual Proceedings Reliability Physics 1992, 1992, pp. 338-343.

* cited by examiner

INTEGRATED CIRCUIT (IC) DEVICE WITH MULTILAYER METAL LINE

BACKGROUND

IC fabrication usually includes two stages. The first stage is referred to as the front end of line (FEOL). The second stage is referred to as the back end of line (BEOL). In the FEOL, individual components (e.g., transistor, capacitors, resistors, etc.) can be patterned in a wafer. In the BEOL, metal layers, vias, and insulating layers can be formed to get the individual components interconnected. The BEOL usually starts with forming the first metal layer on the wafer. The first metal layer is often called M0. More metal layers can be formed on top of M0, and these metal layers are often called M1, M2, and so on.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
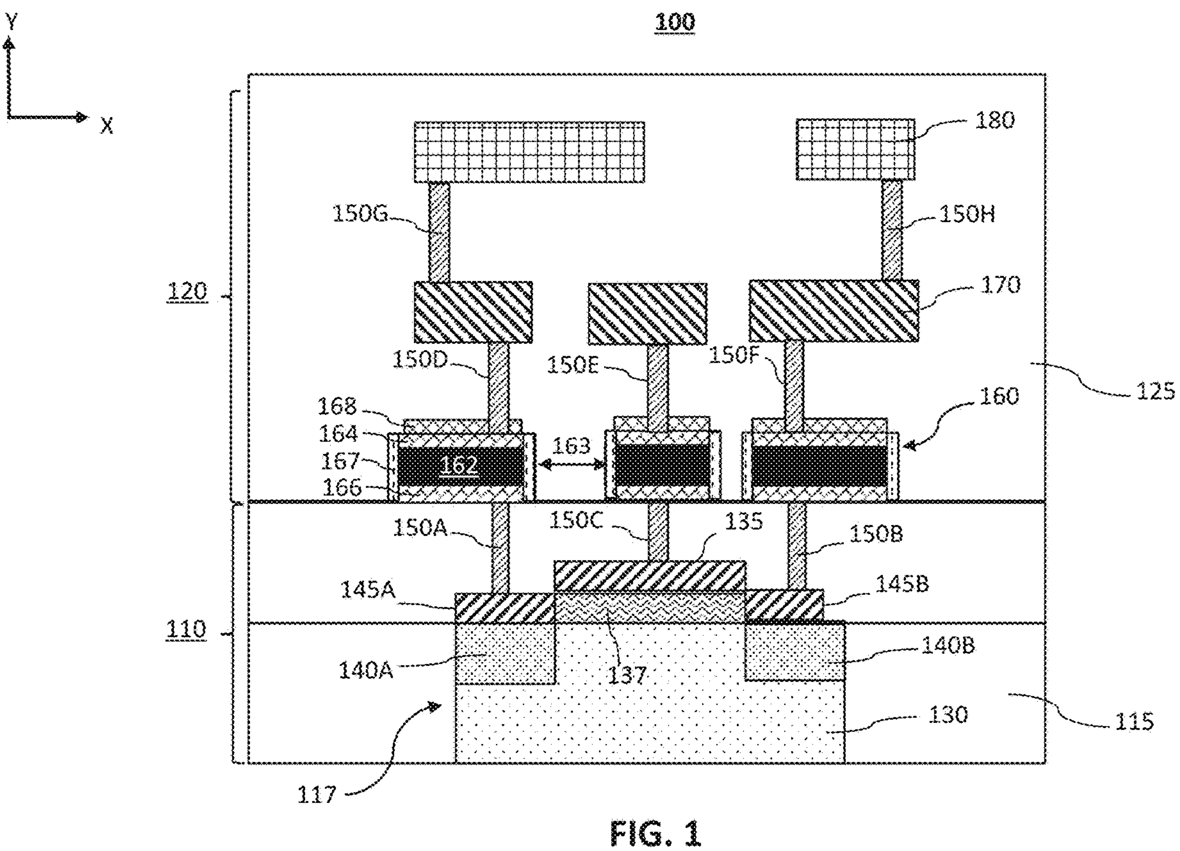
FIG. 1 illustrates an IC device comprising an FEOL section and a BEOL section, according to some embodiments of the disclosure.

The systems, methods, and devices of this disclosure each have several innovative aspects, no single one of which is solely responsible for all the desirable attributes disclosed herein. Details of one or more implementations of the subject matter described in this specification are set forth in the description below and the accompanying drawings.

BEOL interconnects are scaling to increasingly tighter pitches. A pitch is a distance between two adjacent metal lines. Patterning and metallization of these tighter pitches can be highly challenging. An option for scaling interconnects is to use subtractive etch of metals to form open spaces between metal lines and to fill the spaces between the metal lines with electrical insulators. In an example subtractive process, a metal layer may be formed first. One or more portions of the metal layer are etched to form one or more trenches between metal lines. An electrical insulator can be deposited into the one or more trenches to insulate the metal lines from each other. Such a subtractive process can result in pitches under 20 nanometers.

Copper (Cu) has been widely used in BEOL metal layers. However, it is difficult to form tight pitch patterns in Cu through subtractive etch. Other metals, such as Ru and W, have been used in lieu of Cu. However, the resistivity of these metals can be high, especially for certain aspect ratios, such as 2:1 or 3:1. Therefore, currently available technologies fail to provide BEOL interconnects with tight pitches and low resistance. Improved technology for scaling BEOL interconnects is needed.

Embodiments of the present disclosure may improve on at least some of the challenges and issues described above by providing multilayer metal lines that can be fabricated through subtractive etch. An example multilayer metal line includes a metal core that is sandwiched by two metal layers. The metal core constitutes a first layer in the multilayer metal line. The two metal layers constitute a second layer and a third layer in the multilayer metal line. The first layer is between the second layer and the third layer. The first layer includes a metal having relatively low resistance, such as aluminum (Al). The second layer and the third layer may include one or more different metals, such as tungsten (W), ruthenium (Ru), Rhodium (Rd), Iridium (Ir), and so on. In some embodiments, the first layer may be sufficiently larger than the second layer or the third layer. In an example, the height of the first layer is between 15 and 40 nm, and the height of the second layer or the third layer is not greater than 5 nm.

A fourth layer can be formed on top of the second layer. The fourth layer may include a conductive material (such as titanium nitride, tantalum nitride, etc.) or a dielectric material (such as silicon oxide, silicon nitride, titanium oxide, etc.). The fourth layer may be under compressive stress in some embodiments. Alternatively or additionally, the fourth layer may be under tensile stress. The fourth layer may be referred to as a stress layer. The stress layer can minimize defects in the first layer. Also, the side wall(s) of the first may be at least partially coated with a fifth layer. The fifth layer can prevent or minimize formation of aluminum oxide on the side wall to avoid undesired increase in resistance of the multilayer metal line. The fifth layer may also be referred to as a protective layer. The second, third, and fifth layers can prevent or minimize defects in the metal core during fabrication (e.g., back-end deposition at high temperatures) or operation of an IC device where the multilayer metal line is located and therefore, can prevent undesired increase in the resistance of the sandwich structure.

Multilayer metal lines in the present disclosure may be fabricated through subtractive etch. For example, a layered structure can be formed by stacking the first, second, third, and fourth layers. A subtractive etch may be performed to form openings in the layered structure. A hard mask may be used during the subtractive etch to prevent certain portions of the layer structured from being etched. The portions of the layer structures that are not etched may constitute metal lines. The metal lines are separated by the openings. The fifth layer is then formed on side walls of the metal lines. The fifth layer may be an oxygen-free layer that includes minimal or even no oxygen. The fifth layer may be formed in-situ through oxygen-free passivation, e.g., surface nitridization or deposition of a polymer. One or more materials used in in-situ passivation may include no oxygen element. In some embodiments, the formation of the layered structure, subtractive etch, and formation of the fifth layer may be performed in a vacuum chamber, in which the air pressure may be between about $10^{-9}$ to $10^{-6}$ Torr. The vacuum chamber can minimize contamination of the metal core during the fabrication. After the fifth layer is formed, an electrical insulator may be deposited into the openings. A portion of the deposited electrical insulator and the hard mask may be removed, e.g., by polish. The electrical insulator deposited between the metal lines are not removed and can insulate the metal lines from each other.

By using the subtractive etch and non-Cu metals, the fabrication method in the present disclosure can achieve tight pitches, e.g., pitches under 20 nm, or even under 15 nm. The multilayer metal lines in the present disclosure can have significantly lower resistance than currently available metal lines fabricated through subtractive etch. Most of the metal in the multilayer metal line is the metal in the metal core, which has a relatively low resistance. Further, the metal core is enclosed by the second, third, fourth, and fifth layers, which can protect the metal core from oxidation and defects and therefore, prevent undesired increases in the resistance of the metal core. For instance, adding Al core into W-based layers can significantly reduce stack resistance It should be noted that, in some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon" is used to describe an elongated semiconductor structure independent of the shape of the transverse cross-section. Thus, as used herein, the term "nanoribbon" is used to cover elongated semiconductor structures that have substantially rectangular transverse cross-sections (possibly with rounded corners), elongated semiconductor structures that have substantially square transverse cross-sections (possibly with rounded corners), elongated semiconductor structures that have substantially circular or elliptical/oval transverse cross-sections, as well as elongated semiconductor structures that have any polygonal transverse cross-sections.

In the following, some descriptions may refer to a particular source or drain (S/D) region or contact being either a source region/contact or a drain region/contact. However, unless specified otherwise, which region/contact of a transistor or diode is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a substrate that includes electrically conductive interconnect structures for providing electrical connectivity between different IC components. Metal layers described herein may also be referred to as "interconnect layers" to clearly indicate that these layers include electrically conductive interconnect structures which may, but do not have to be, metal.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art. Also, the term "or" refers to an inclusive "or" and not to an exclusive "or."

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of varactor devices with backside electrical contacts as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various varactor devices with backside electrical contacts as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 illustrates an IC device 100 comprising an FEOL section 110 and a BEOL section 120, according to some embodiments of the disclosure. The FEOL section 110 includes a support 115 and a transistor 117. The BEOL section 120 includes metal lines 160, 170, and 180. In other embodiments, the IC device 100 may include fewer, more, or different components. For instance, the FEOL section 110 may include more transistors, or other semiconductor devices not shown in FIG. 1. Also, the BEOL section 120 may include fewer or more metal layers.

The support 115 may be any suitable structure, such as a substrate, a die, a wafer, or a chip, based on which the transistor 117 can be built. The support 115 may, e.g., be the wafer 2000 of FIG. 6A, discussed below, and may be, or be included in, a die, e.g., the singulated die 2002 of FIG. 6B, discussed below. In some embodiments, the support 115 may be a semiconductor substrate composed of semiconductor material systems including, for example, N-type or P-type materials systems, and, in some embodiments, the channel region 130, described herein, may be a part of the support 115. In some embodiments, the semiconductor substrate may be a crystalline substrate formed using a bulk silicon or a silicon-on-insulator substructure. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the support structure may be a printed circuit board (PCB) substrate. One or more transistors, such as the transistor 117 may be built on the support 115.

Although a few examples of materials from which the support 115 may be formed are described here, any material that may serve as a foundation upon which an IC may be built falls within the spirit and scope of the present disclosure. In various embodiments, the support 115 may include any such substrate, possibly with some layers and/or devices already formed thereon, not specifically shown in the present figures. As used herein, the term "support" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support 115 may provide material "support" in that, e.g., the IC devices/structures described herein are build based on the semiconductor materials of the support 115. However, in some embodiments, the support 115 may provide mechanical support.

The transistor 117 may be a field-effect transistor (FET), such as metal-oxide-semiconductor FET (MOSFET), tunnel FET (TFET), fin-based transistor (e.g., FinFET), nanoribbon-based transistor, nanowire-based transistor, gate-all-around (GAA) transistor, other types of FET, or a combination of both. A transistor 117 includes a semiconductor structure that includes a channel region 130, a source region 140A, and a drain region 140B. The semiconductor structure of the transistor 117 may be at least partially in the support 115. The support 115 may include a semiconductor material, from which at least a portion of the semiconductor structure is formed. The semiconductor structure of the transistor 117 (or a portion of the semiconductor structure, e.g., the channel region 130) may be a planar structure or a non-planar structure. A non-planar structure is a three-dimensional structure, such as fin, nanowire, or nanoribbon. A non-planar structure may have a longitudinal axis and a transvers cross-section perpendicular to the longitudinal axis. In some embodiments, a dimension of the non-planar structure along the longitudinal axis may be greater than dimensions along other directions, e.g., directions along axes perpendicular to the longitudinal axis.

The channel region 130 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nanometers and 100 nanometers, including all values and ranges therein.

For some example n-type transistor embodiments (i.e., for the embodiments where the transistor 117 is an NMOS (N-type metal-oxide-semiconductor) transistor or an n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some InxGa1-xAs fin embodiments, In content (x) may be between 0.6 and 0.9, and may advantageously be at least 0.7 (e.g., In0.7Ga0.3As). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below 1015 dopant atoms per cubic centimeter (cm-3), and advantageously below $10^{13}$ $cm^{-3}$. These materials may be amorphous or polycrystalline, e.g., having a crystal grain size between 0.5 nanometers and 100 nanometers.

For some example p-type transistor embodiments (i.e., for the embodiments where the transistor 117 is a PMOS (P-type metal-oxide-semiconductor) transistor or a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin-film transistor (TFT), the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin-film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The source region 140A and the drain region 140B are connected to the channel region 130. The source region 140A and the drain region 140B each includes a semiconductor material with dopants. In some embodiments, the source region 140A and the drain region 140B have the same semiconductor material, which may be the same as the channel material of the channel region 130. A semiconductor material of the source region 140A or the drain region 140B may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur(S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

In some embodiments, the dopants in the source region 140A and the drain region 140B are the same type. In other embodiments, the dopants of the source region 140A and the drain region 140B may be different (e.g., opposite) types. In an example, the source region 140A has n-type dopants and the drain region 140B has p-type dopants. In another example, the source region 140A has p-type dopants and the drain region 140B has n-type dopants. Example n-type dopants include Te, S, As, tin (Sn), Si, Ga, Se, S, In, Al, Cd, chlorine (Cl), iodine (I), fluorine (F), and so on. Example p-type dopants include beryllium (Be), Zn, magnesium (Mg), Sn, P, Te, lithium (Li), sodium (Na), Ga, Cd, and so on.

In some embodiments, the source region 140A and the drain region 140B may be highly doped, e.g., with dopant concentrations of about $1 \cdot 10^{21}$ $cm^{-3}$, in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the source region 140A and the drain region 140B may be the regions having dopant concentration higher than in other regions, e.g., higher than a dopant concentration in the channel region 130, and, therefore, may be referred to as "highly doped" (HD) regions.

The channel region 130 may include one or more semiconductor materials with doping concentrations significantly smaller than those of the source region 140A and the drain region 140B. For example, in some embodiments, the channel material of the channel region 130 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material is still significantly lower than the dopant level in the source region 140A and the drain region 140B, for example below $10^{15}$ $cm^{-3}$ or below $10^{13}$ $cm^{-3}$. Depending on the context, the term "S/D terminal" may refer to a S/D region or a S/D contact or electrode of a transistor.

The transistor 117 also includes a source contact 145A over the source region 140A and a drain contact 145B over the drain region 140B. The source contact 145A and the drain contact 145B are electrically conductive and may be coupled to source and drain terminals for receiving electrical signals. The source contact 145A or the drain contact 145B includes one or more electrically conductive materials, such as metals. Examples of metals in the source contact 145A and the drain contact 145B may include, but are not limited to, Ru, Cu, Co, palladium (Pd), platinum (Pt), nickel (Ni), and so on.

The transistor 117 also includes a gate that is over or wraps around at least a portion of the channel region 130. The gate includes a gate electrode 135 and a gate insulator 137. The gate electrode 135 can be coupled to a gate terminal that controls gate voltages applied on the transistor 117. The gate electrode 135 may include one or more gate electrode materials, where the choice of the gate electrode materials may depend on whether the transistor 117 is a p-type transistor or an n-type transistor. For a p-type transistor, gate electrode materials that may be used in different portions of the gate electrode may include, but are not limited to, Ru, Pd, Pt, Co, Ni, and conductive metal oxides (e.g., ruthenium oxide). For an n-type transistor, gate electrode materials that may be used in different portions of the gate electrode, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 135 may include a stack of a plurality of gate electrode materials, where zero or more materials of the stack are workfunction (WF) materials and at least one material of the stack is a fill metal layer. Further materials/layers may be included next to the gate electrode for other purposes, such as to act as a diffusion barrier layer or/and an adhesion layer.

The gate insulator 137 separates at least a portion of the channel region 130 from the gate electrode 135 so that the channel region 130 is insulated from the gate electrode 135. In some embodiments, the gate insulator 137 may wrap around at least a portion of the channel region 130. The gate insulator 137 may also wrap around at least a portion of the source region 140A or the drain region 140B. At least a portion of the gate insulator 137 may be wrapped around by the gate electrode. The gate insulator 137 includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

In the embodiments of FIG. 1, the transistor 117 is coupled to the metal lines 160 (individually referred to as "metal line 160"). The metal lines 160 are further couples to the metal lines 170 (individually referred to as "metal line 170") and metal lines 180 (individually referred to as "metal line 180"). The metal lines 160, 170, or 180 may facilitate supply of electrical signals to the transistor 117. Even though not shown in FIG. 1, the metal lines 160, 170, or 180 may be coupled with other devices than the transistor 117, such as diodes, power sources, resistors, capacitors, inductors, sensors, transceivers, receivers, antennas. The transistor 117 and the metal lines 160, 170, and 180 are coupled through vias 150A-150H (collectively referred to as "vias 150" or "via 150"). A via 150 may be electrically conductive. A via 150 may include a metal, such as tungsten (W), Cu, or other metals. Different vias 150 may include different materials. The vias 150 can provide a conductive channel between the transistor 117 and the metal lines 160 or between the metal lines 160, 170, and 180.

The metal lines 160, 170, and 180 are stacked over the transistor 117 along the Y axis. The metal lines 160 may constitute the metal layer that is arranged closest to the FEOL section 110. In some embodiments, the metal layer may be referred to as M0. The metal lines 170 may be constitute the second metal layer, which may be referred to as M1. The metal lines 180 may be constitute the third metal layer, which may be referred to as M2. There may be one or more metal layers that are arranged on top of the metal lines 180, which may be referred to as M3, M4, and so on. The metal lines 160, 170, and 180 may be insulated from each other by a BEOL insulator 125. The BEOL insulator 125 may include an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc.

For purpose of illustration, FIG. 1 shows three metal lines 160. In other embodiments, the first metal layer may include fewer or more metal lines. Each metal line 160 is a multilayer structure. As shown in FIG. 1, a metal line 160 includes a metal core 162, layers 164, 166, 167, and 168. The metal core 162 and the layers 164 and 166 constitute a sandwich structure with the metal core 162 in the middle. Even though the sandwich structure has a rectangular cross-section in the X-Y plane in FIG. 1, the cross-section of the sandwich structure may have a different shape. For instance, the cross-section of the sandwich structure may be a trapezoid. In some embodiments (e.g., embodiments where the metal line 160 is fabricated through a damascene process), the layer 164 may be wider than the layer 166 along the X axis. In other embodiments (e.g., embodiments where the metal line 160 is fabricated through a subtractive process), the layer 164 may be narrower than the layer 166 along the X axis.

The metal core 162 may include Al. The layer 164 or 166 may include a different metal, which may have a higher resistance than the metal in the metal core. Examples of the metal in the layer 164 or 166 include W, Ru, Rd, Rh, Ir, and so on. The layer 168 is over the layer 164. The layer 168 may include an oxide or nitride material, such as silicon oxide, silicon nitride, titanium nitride, titanium oxide, and so on. The layer 168 may be electrically insulative or conductive. The layer 167 are on the side wall of the sandwich structure. The layer 167 may include a ceramic or polymer. In some embodiments, the layer 167 is oxygen-free. Even though the layer 167 is on the side wall of the whole sandwich structure in FIG. 1, the layer 167 in other embodiment may be on the side wall of a portion of the sandwich structure. For instance, the layer 167 may be on the side wall of the metal core 162, but is not on the side wall of the layer 164 or 166. In other embodiments, the layer 167 may be on the side wall of the layer 168.

In some embodiments, a height of the metal core 162 in a direction along the Y axis is in a range from 15 to 40 nm. A height of the layer 164 or 166 along the Y axis is in a range from 2 to 5 nm. A height of the layer 168 along the Y axis is in a range from 5 to 20 nm. As the metal core 162 can constitute most of the sandwich structure, the overall resistance of the metal line 160 is similar to the low resistance of the metal core 162. The metal core 162 may be enclosed by the layers 164, 166, and 167 and the layer 168, which can prevent increase in the resistance of the metal core 162 due to contamination (e.g., oxidization, etc.) or defects. In some embodiments, the height of the metal line 160 along the Y axis may be 2-3 time of the width of the metal line 160 along the X axis. The weight of the metal core 162 may be 15 nm or below. A distance between two adjacent metal lines 160 may be a pitch 163 of the first metal layer. The pitch 163 may be 20 nm or below. The metal lines 160 can have a tight pitch pattern.

The metal lines 160 may be at different electrical potentials during operation of the IC device 100. The metal lines 160 are connected to the via 150A-150C, which are further connected to the source contact 145A, the drain contact 145B, and the gate electrode 135. The metal lines 160 may control operation of the transistor 117 by providing electrical signals to the source contact 145A, the drain contact 145B, and the gate electrode 135.

The metal lines 160 are connected to the via 150D-150F, which are further connected to the metal lines 170. The metal lines 170 are electrically conductive. In some embodiments, a metal line 170 may also be a multilayer structure that is the same as or similar to the metal lines 160. In other embodiments, the metal line 170 may be a single layer structure and may include a metal that is different from the metal core 162. In an example, a metal line 170 may include Cu. The metal lines 170 are coupled to the metal lines 180 through the vias 150G and 150H. The metal lines 180 are also electrically conductive. In some embodiments, a metal line 180 may be a multilayer structure that is the same as or similar to the metal lines 160. In other embodiments, the metal line 180 may be a single layer structure and may include a metal that is different from the metal core 162. In an example, a metal line 180 may include Cu.

Figure 2:
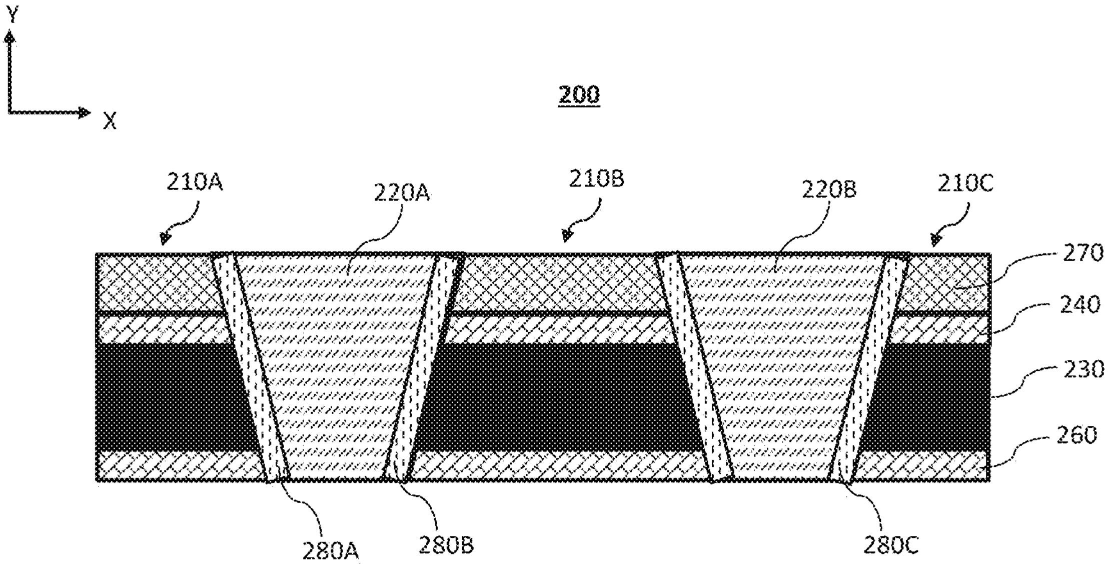
FIG. 2 illustrates a cross-sectional view of an example metal layer, according to some embodiments of the disclosure.

FIG. 2 illustrates a cross-sectional view of an example metal layer 200 with multilayer metal lines 210A-210C (collectively referred to as "multilayer metal lines 210" or "multilayer metal line 210"), according to some embodiments of the disclosure. The metal layer 200 also includes insulative structures 220A and 220B. The insulative structure 220A is between the metal lines 210A and 210B. The insulative structures 220B is between the metal lines 210B and 210C. A metal line 210 may be an embodiment of the metal line 160 in FIG. 1. FIG. 2 may not show the whole metal layer 200. For instance, FIG. 2 may show a portion of the metal line 210A or 210C. Also, the metal layer 200 may include fewer or more metal lines. The cross-sectional view in FIG. 2 is in the X-Y plane.

Each multilayer metal line 210 is a multilayer structure. As shown in FIG. 2, the multilayer structure includes layers 230, 240, 260, and 270. The layers 230, 240, 260, and 270 are stacked on one another in along the Y axis. The layer 230 is between the layers 240 and 260. The layer 270 is over the layer 240. In some embodiments, the layers 230, 240, 260, and 270 include different materials. For instance, the layer 230 includes metal, e.g., Al. The layers 240 and 260 includes a different metal, e.g., W, Ru, Rd, Ir, and so on. The layer 270 includes a dielectric material. The layers 230, 240, 260, and 270 may also have different dimensions. The layer 230 may be thicker than the layer 240 or 260. In some embodiment, the thickness of the layer 230 along the Y axis may be 4-20 times of the thickness of the layer 240 or 260 along the Y axis. For instance, the thickness of the layer 230 may be between about 15 and 40 nm, and the thickness of the layer 240 or 260 may be between about 2 and 5 nm. The thickness of the layer 270 along the Y axis may be between about 5 and 20 nm. FIG. 2 shows that the layer 240 in a metal line 210 is narrower along the X axis than the layer 260 in the metal line 210. In other embodiments, the layer 240 may be wider than the layer 260 along the X axis. Also, the width of the top surface of the layer 230 in a metal line 210 may be smaller than the bottom surface of the layer 230. The differences in the widths of the layers 230, 240, and 260 may be caused by a subtractive etch of the layers 230, 240, 260, and 270.

The multilayer metal lines 210A-210C also includes layers 280A-280C (individually referred to as "layer 280"), respectively. A layer 280 may be curved. In embodiments of FIG. 2, a layer 280 may wrap around the side walls of the layers 230, 240, 260, and 270 in a metal line 210. In other embodiments, a layer 280 may wrap around the side walls of some of the layers 230, 240, 260, and 270 (e.g., the layer 230, the layers 230 and 240, or the layers 230, 240, and 260) in a metal line 210. In some embodiments, a layer 280 includes an oxygen-free electrical insulator.

The metal lines 210A-210C are separated by the insulative structures 220A and 220B. Each of the insulative structures 220A and 220B includes an electrical insulator, such as a dielectric material, hysteretic material, and so on. Example dielectric material includes oxide (e.g., Si based oxides, metal oxides, etc), high-k dielectric, and so on. Example hysteretic material include ferroelectric materials, antiferroelectric materials, etc. The insulative structures 220A and 220B may be formed through deposition. More details regarding fabricating metal lines are described below in conjunction with FIGS. 4A-4G.

Figure 3:
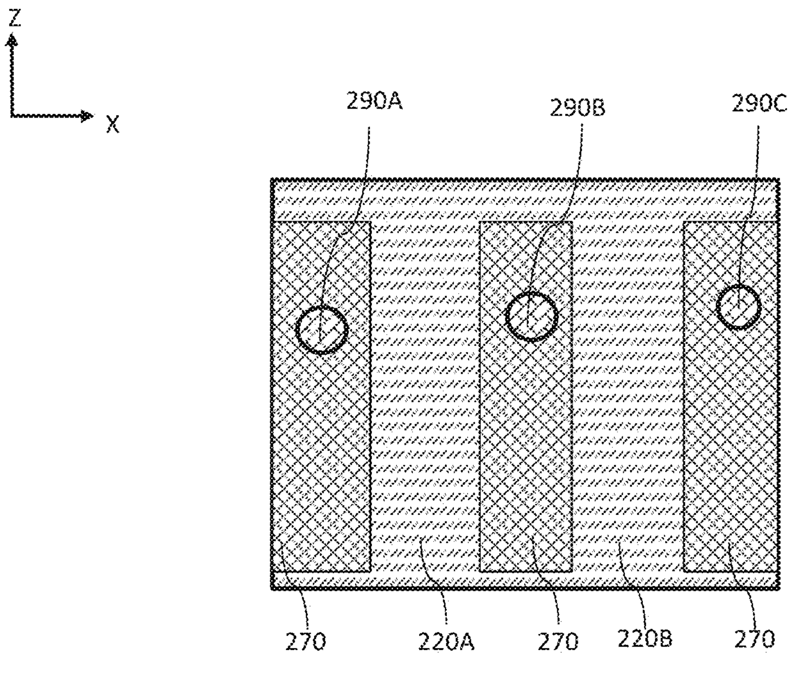
FIG. 3 illustrates another cross-sectional view of the metal layer in FIG. 2, according to some embodiments of the disclosure.

FIG. 3 illustrates another cross-sectional view of the metal layer 200 in FIG. 2, according to some embodiments of the disclosure. The cross-sectional view in FIG. 3 is in the X-Z plane. FIG. 3 shows that the layers 280A-280C wraps around the layers 230, 240, and 260, which are underneath the layer 270. FIG. 3 also shows that the metal lines 210A-210C are connected to vias 290A-290C (collectively referred to as "vias 290" or "via 290"). In other embodiments, a metal line 210 may be connected to no via, or more than one via 290. In some embodiments (e.g., embodiments where the layer 270 is conductive), a via 290 may connect with the layer 270. In other embodiments, the via 290 may penetrate the layer 270 and connect with the layer 260 directly. An opening can be formed in the layer 270, e.g., through etch. Then an electrically conductive material may be deposited into the opening to form a portion of the via 290. More details regarding forming vias for metal lines are described below in conjunction with FIGS. 5A-5D.

Figure 4A:
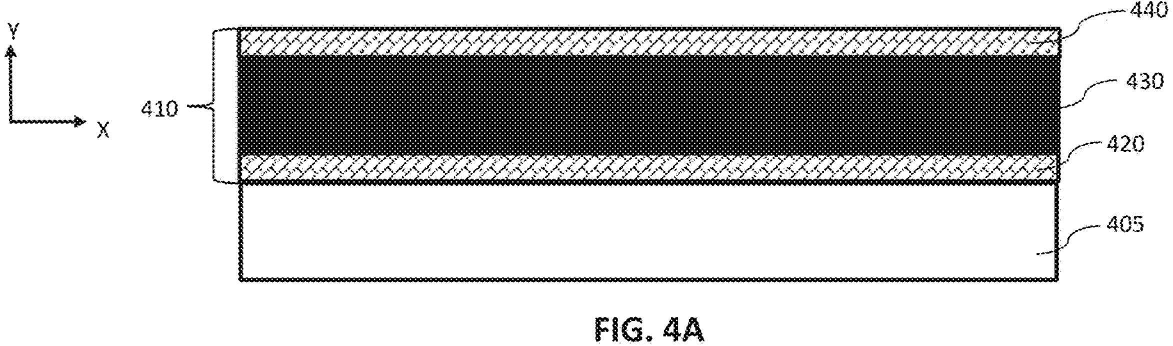
FIGS. 4A-4G illustrate a process of forming multilayer metal lines, according to some embodiments of the disclosure.
Figure 4B:
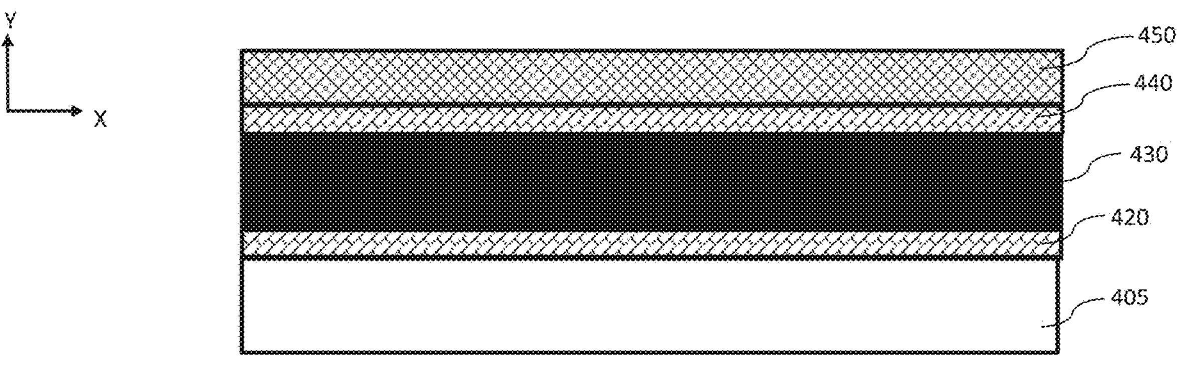
Figure 4C:
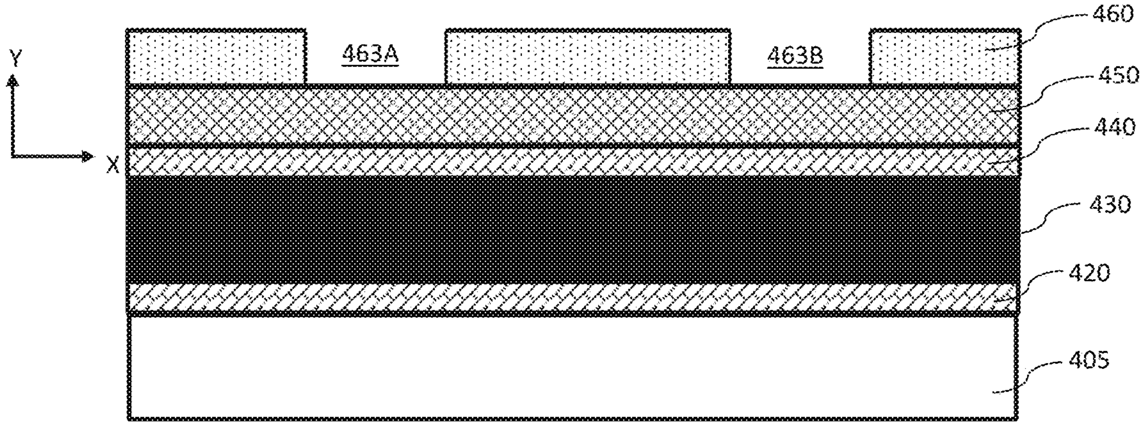
Figure 4D:
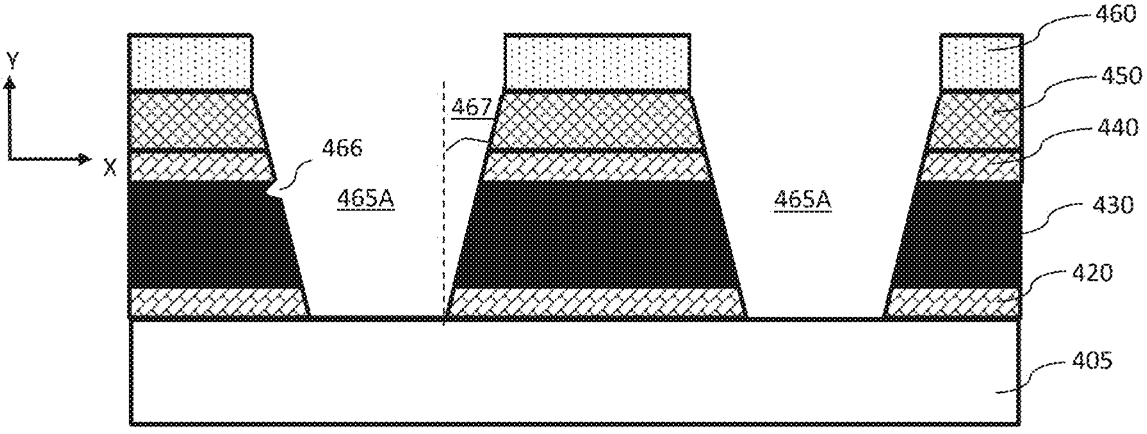
Figure 4E:
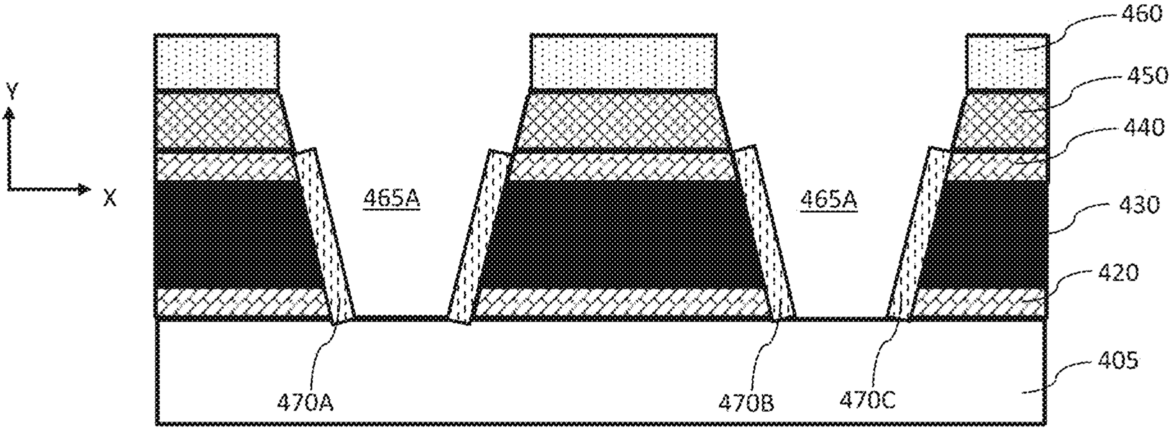
Figure 4F:
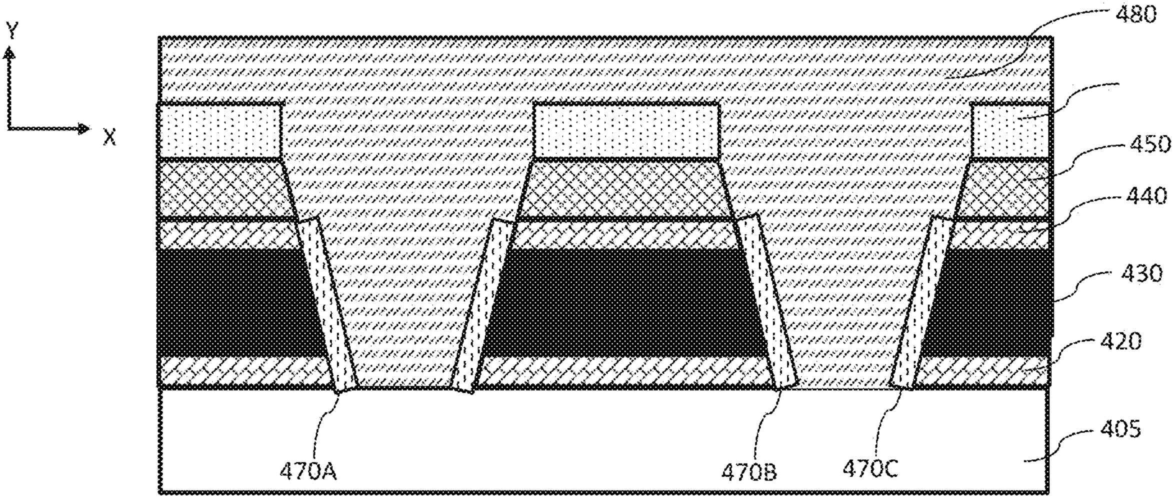
Figure 4G:
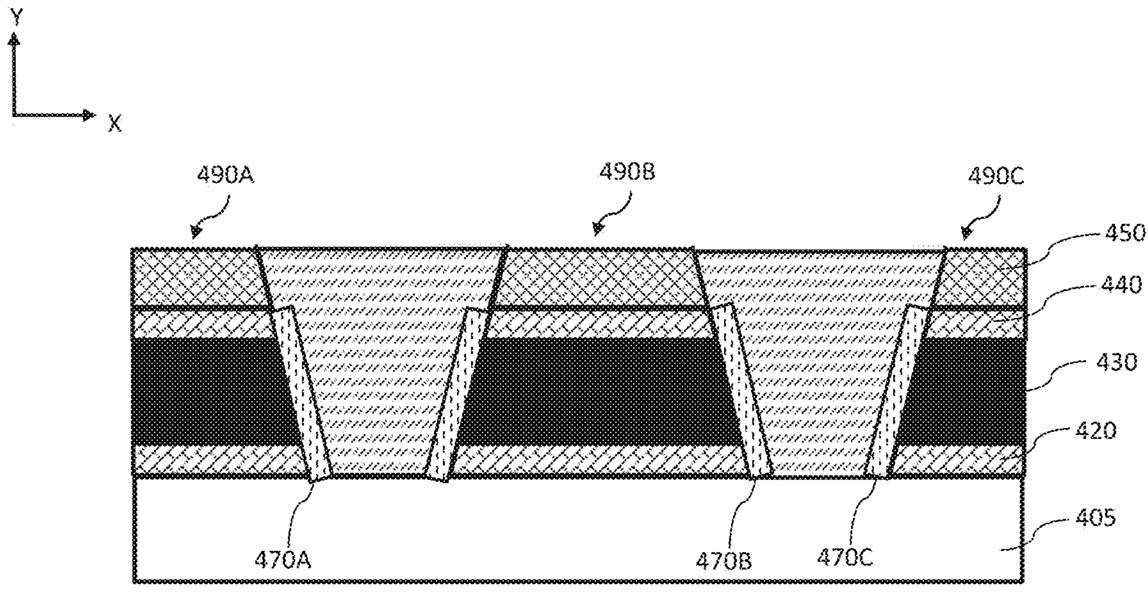

FIGS. 4A-4G illustrate a process of forming multilayer metal lines 490A-490C, according to some embodiments of the disclosure. The multilayer metal lines 490A-490C are shown in FIG. 4G. The multilayer metal lines 490A-490C may be embodiments of the metal lines 160 in FIG. 1 or the metal lines 210 in FIG. 2.

In FIG. 4A, a sandwich structure 410 is formed over a structure 405. The structure 405 may be a support (e.g., the support 115), a FEOL section (e.g., the FEOL section 110), or a structure including a metal line. The sandwich structure 410 includes three layers 420, 430, and 440. In some embodiments, the sandwich structurer 410 includes multiple metals. For instance, the layer 430 may include a different metal from the layer 430 or 440. The sandwich structurer 410 may be formed by depositing a first metal onto the structure 405 to form the layer 420, then depositing a second metal onto the layer 420 to form the layer 430, and further depositing a third metal onto the layer 430 to form the layer 440. The first metal or the third metal may be W, Rh, Rd, Ir, and so on. The second metal may be Al. The deposition may be chemical vapor deposition (e.g., plasma enhanced chemical vapor deposition, atomic layer deposition, etc.), physical vapor deposition (e.g., thermal evaporation, etc.) and so on. The deposition may be controlled based on target thicknesses of the layers 420, 430, and 440. In an example, the layer 420 or 440 has a thickness of about 2-5 nm, and the layer 430 has a thickness of 20-40 nm. The process in FIG. 4A may be performed in a controlled environment. For instance, the process in FIG. 4A may be performed in an environment having a pressure between $10^{-9}$ to $10^{-6}$ Torr. In some embodiments, a temperature in the environment may also be controlled to maintain at a specific temperature or a temperature range.

In FIG. 4B, another layer 450 is formed over the layer 440. The layer 450 may be deposited onto the layer 440. In some embodiments, the layer 450 includes a dielectric material, such as silicon oxide, silicon nitride, titanium oxide, titanium nitride, and so on. The deposition may be chemical vapor deposition (e.g., plasma enhanced chemical vapor deposition, atomic layer deposition, etc.), physical vapor deposition (e.g., thermal evaporation, etc.) and so on. The deposition may be controlled so that the thickness of the layer 450 can reach a target thickness, e.g., about 5-20 nm. In some embodiments, the process in FIG. 4B may be performed in a controlled environment, which may be the same controlled environment where the process in FIG. 4A was performed.

In FIG. 4C, a hard mask 460 is formed over the layer 450. The hard mask 460 is formed with openings 463A and 463B. In some embodiments, the hard mask 460 includes a material, examples of which may include silicon dioxide, titanium nitride, amorphous carbon tantalum nitride, silicon nitride (e.g., $Si_3N_4$), Ru, cobalt, manganese oxide, and so on. The deposition may be chemical vapor deposition (e.g., plasma enhanced chemical vapor deposition, atomic layer deposition, etc.), physical vapor deposition (e.g., thermal evaporation, etc.) and so on. The deposition may be controlled so that the thickness of the hard mask 460 along the Z axis can reach a target thickness, e.g., about 15-22 nm. The hard mask 460 may include multiple layers. The layers may include different materials. For example, the hard masks 460 may include a layer of silicon dioxide and another layer of silicon nitride. As another example, the hard masks 460 may include a layer of silicon dioxide and another layer of Ru. In some embodiments, the process in FIG. 4C may be performed in a controlled environment, which may be the same controlled environment where the process in FIG. 4A or FIG. 4B was performed.

In FIG. 4D, openings 465A and 465B are formed in the layers 420, 430, 440, and 450. The openings 465A and 465B may be formed through a subtractive etch process, which targets at portions of the layers 420, 430, 440, and 450 under the opening 463A and 463B. The subtractive etch may be a halogen-based etch. Chemicals may be used in the subtractive etch. The chemicals may include fluorine, chlorine, or other halogen chemical elements. The rest of the layers 420, 430, 440, and 450 may be minimally etched or not etched at all. In some embodiments, side walls of the openings 465A and 465B may not be straight along the Z axis. Rather, there may be an angle 467 between the side edges and the Z axis. The angle 476 may be about 2 degrees. The openings 465A and 465B may be wider at the top and narrower at the bottom. In some embodiments, a notch 466 may be formed around the interface between the layers 440 and 430, e.g., due to different metals used in the layers 440 and 430 and the attributes of the etching process. In other embodiments, the notch 466 is not formed. For purpose of simplicity and illustration, the notch 466 is not shown in FIGS. 4E-4G. In some embodiments, the subtractive etch in FIG. 4D may be performed in a controlled environment, which may be the same controlled environment where the process in FIG. 4A was performed.

In FIG. 4E, layers 470A-470C are formed on side walls of sandwich structures including the layers 420, 430 and 440. The openings 465A and 465B are between the side walls. The layers 470A-470C may be formed through oxygen-free passivation. In an embodiment, the layers 470A-470C are formed through a surface nitridation treatment. The material in the layers 470A-470C may include nitrogen. In another embodiment, the layers 470A-470C are formed by depositing a polymer, such as a $CH_4$ based polymer. The material in the layers 470A-470C may include carbon. The material in the layers 470A-470C may be electrically insulative. Even though the layers 470A-470C in FIG. 4E are over the side walls of the sandwich structures, the layers 470A-470C in other embodiments may be over the side walls of the layer 450 or the hard mask 460. The layers 470A-470C may also be over the top surface of the hard mask 460. In some embodiments, the process in FIG. 4E may be performed in a controlled environment, which may be the same controlled environment where the process in FIG. 4A was performed.

In FIG. 4F, an electrical insulator 480 is added. The electrical insulator 480 fills the openings 465A and 465B and covers the top surface of the hard mask 460. In some embodiments, the electrical insulator 480 may be added through interlayer dielectric deposition. The electrical insulator 480 may be a dielectric material, hysteretic material, and so on. Example dielectric material includes oxide (e.g., Si based oxides, metal oxides, etc.), high-k dielectric, and so on. Example hysteretic material include ferroelectric materials, antiferroelectric materials, etc. In some embodiments, the process in FIG. 4F may be performed in a controlled environment, which may be different from the controlled environment where the process in FIG. 4A was performed. For instance, the controlled environment for the process in FIG. 4F may have a higher temperature, e.g., about 400° C. The higher temperature may facilitate annealing of the electrical insulator 480.

In FIG. 4G, a portion of the electrical insulator 480 and the hard mask 460 are removed, e.g., by polishing. The portion of the electrical insulator 480 may be the portion that is above the layer 450. The layer 450 may be slightly polished or not polished at all. After the polishing processing, the multilayer metal lines 490A-490C are formed. Even though not shown in FIG. 4G, a notch (e.g., the notch 466 shown in FIG. 4D) may be at the interface between the layers 440 and 430 in the multilayer metal lines 490A-490C.

In the embodiments of FIGS. 4A-4G, the multilayer metal lines 490A-490C are formed based on a subtractive etch process in which metal layers 420, 430, and 440 are etched to form openings, which are then filled by an electrical insulator 480. In other embodiments, the multilayer metal lines 490A-490C may be formed based on a damascene process in which an electrical insulator layer may be etched to form openings, which are then filled by the multilayer metal lines 490A-490C. In embodiments where a damascene process is used, the shape of the multilayer metal lines 490A-490C may be different from FIG. 4G. For instance, the layer 440 in a multilayer metal line may be wider than the layer 420 in the multilayer metal line along the X axis, as the openings formed in both processes may be wider on the top and narrower on the bottom.

Figure 5A:
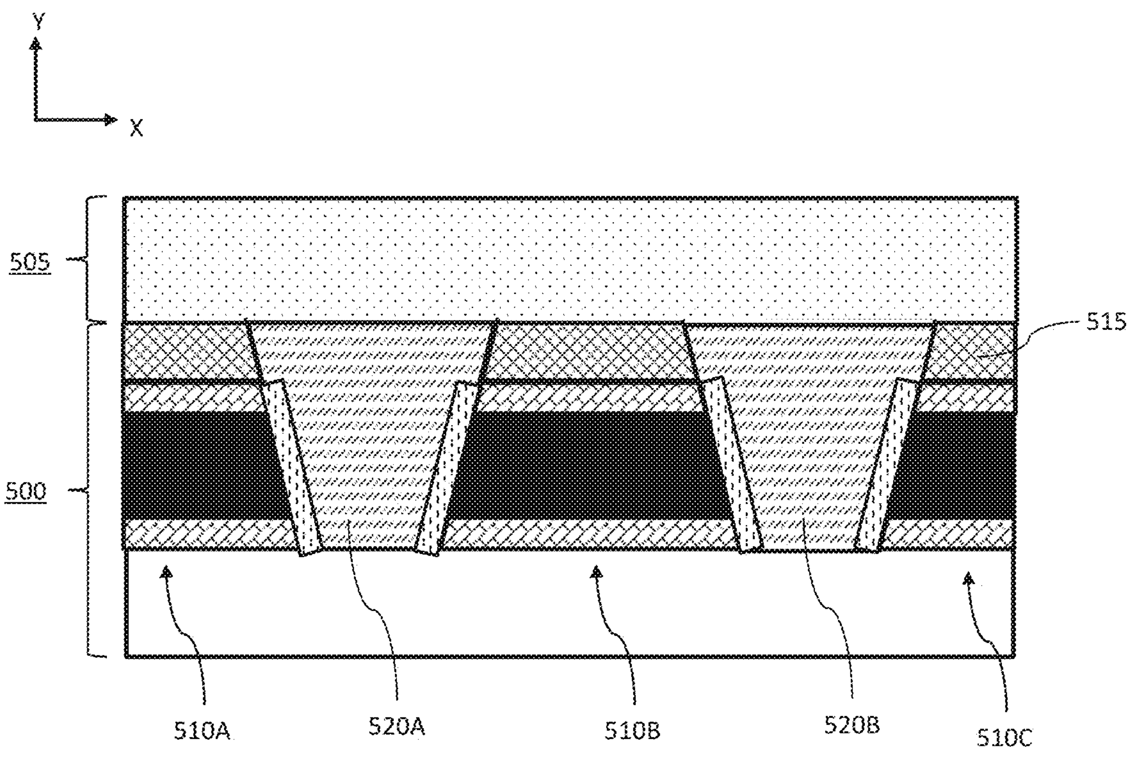
FIGS. 5A-5D illustrate a process of forming vias for a metal layer, according to some embodiments of the disclosure.
Figure 5B:
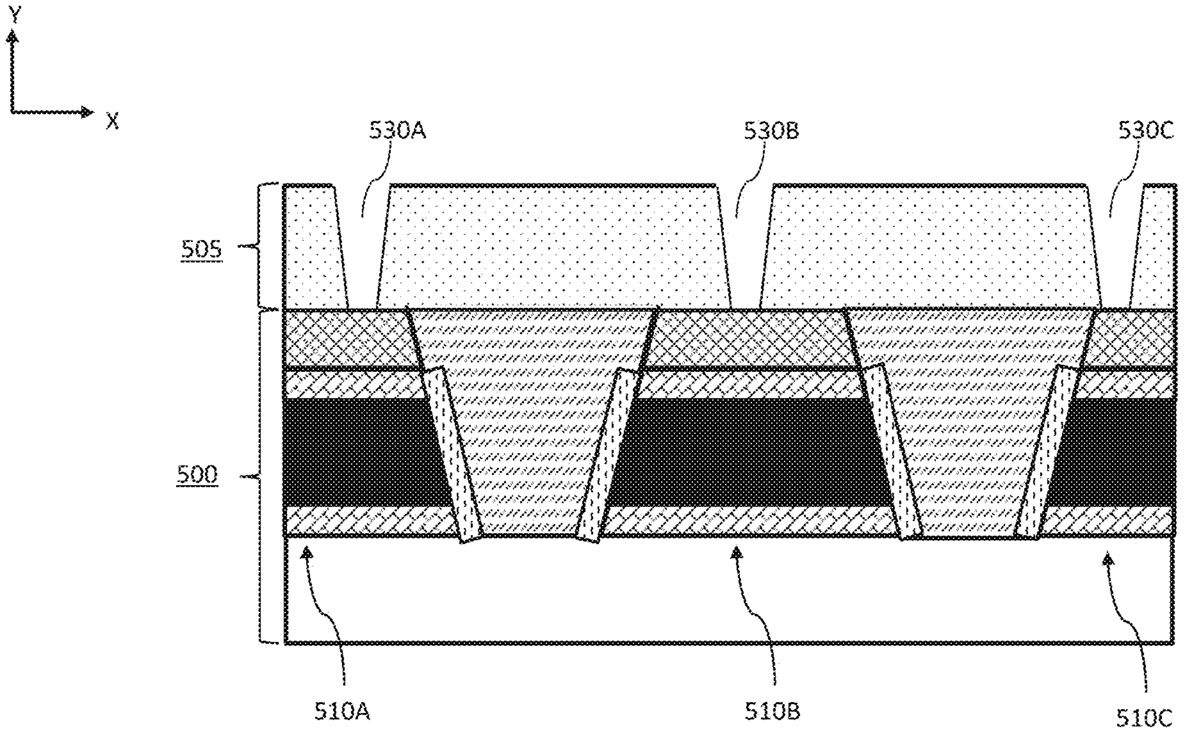
Figure 5C:
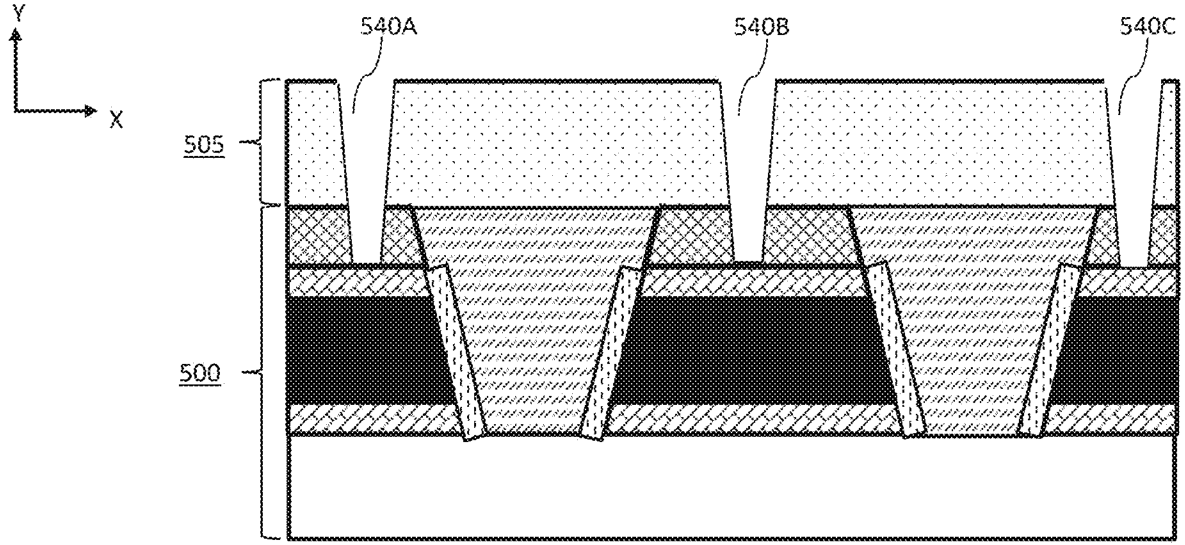
Figure 5D:
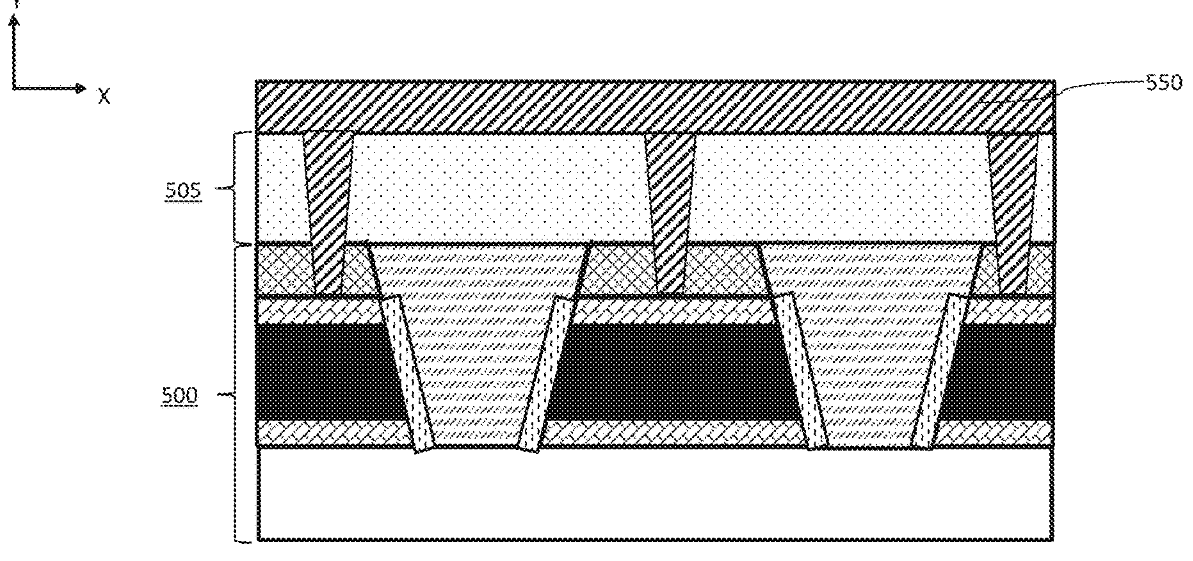
Figure 5E:
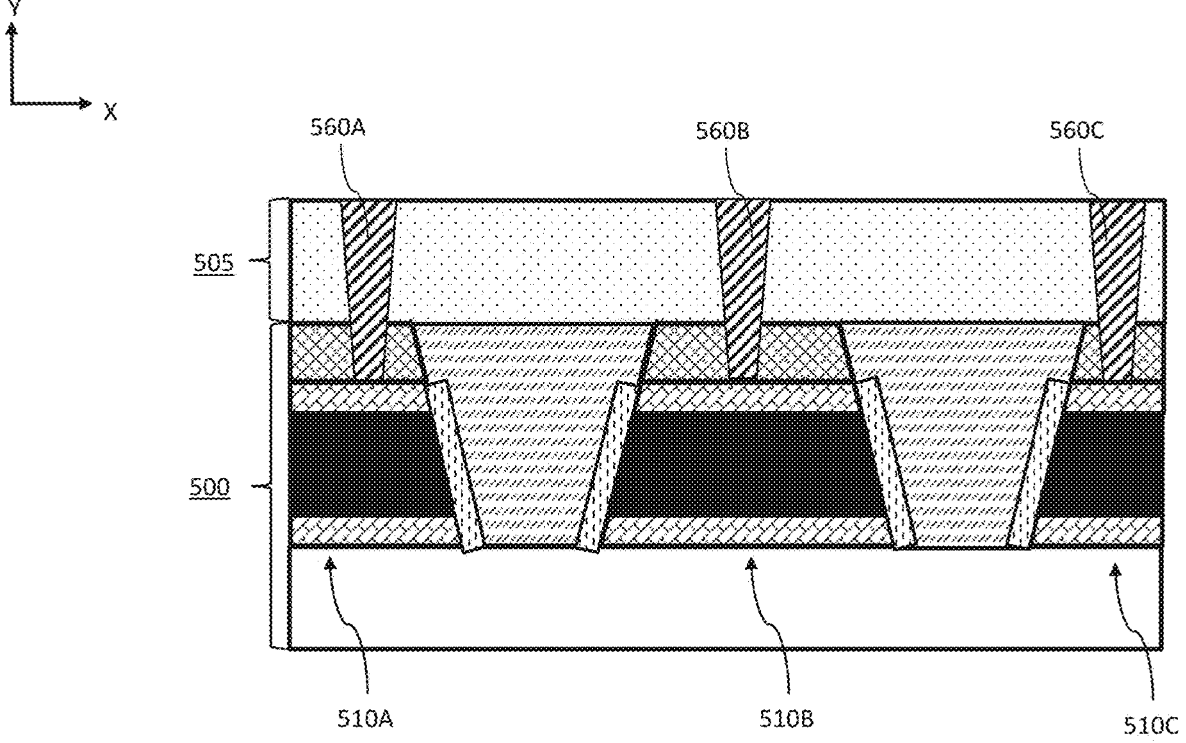

FIGS. 5A-5E illustrate a process of forming vias 560A-560C for a metal layer 500, according to some embodiments of the disclosure. The vias 560A-560C are shown in FIG. 5E. The metal layer 500 includes multilayer metal lines 510A-510C and insulative structures 520A and 530B. The insulative structures 520A and 530B separates the multilayer metal lines 510A-510C from each other. The metal layer 500 may be fabricated by the process shown in FIGS. 4A-4G.

In FIG. 5A, a layer 505 is formed over the metal layer 500. The layer 505 may be formed by depositing an electrical insulator onto the top surface of the metal layer 500. The deposition may be an interlayer dielectric deposition. In some embodiments, the deposition may be chemical vapor deposition (e.g., plasma enhanced chemical vapor deposition, atomic layer deposition, etc.), physical vapor deposition (e.g., thermal evaporation, etc.) and so on. The electrical insulator may be a dielectric material, hysteretic material, and so on.

In FIG. 5B, openings 530A-530B are formed in the layer 505. In some embodiments, the openings 530A-530B may be formed through etch, e.g., chemical etch. The openings 530A-530B are over the multilayer metal lines 510A-510C, respectively. Even though not shown in FIG. 5B, a mask may be placed over the layer 505 to avoid etching of other portions of the layer 505. As shown in FIG. 5B, the openings 530A-530B stop at a layer 515 in each of the multilayer metal lines 510A-510C. The layer 515 may be an embodiment of the layer 168 in FIG. 1, the layer 270 in FIGS. 2 and 3, or the layer 450 in FIGS. 4A-4G. The layer 515 may function as an etch stop in FIG. 5B. The layer 515 may prevent over-etching that can damage the multilayer metal lines 510A-510C. In some embodiments, the etch of the electrical insulator is stopped at the layer 515.

In FIG. 5C, portions of the layer 515 is removed to form new openings 540A-540C. The openings 540A-540C penetrate through the layer 515. In some embodiments, the openings 540A-540C may be formed through etch, which may be different from the etch in FIG. 5B. In an example, the etch in FIG. 5C is dry etch, which can be controlled to etch through the layer 515 but to minimize or prevent etch the layer(s) underneath the layer 515.

In FIG. 5D, a metal 550 is added. The metal 550 fills the openings 540A-540C. The metal 550 also covers the layer 505. In some embodiments, the metal 550 may be added through deposition or electroplating. The deposition may be chemical vapor deposition (e.g., plasma enhanced chemical vapor deposition, atomic layer deposition, etc.), physical vapor deposition (e.g., thermal evaporation, etc.) and so on.

In FIG. 5E, a portion of the metal 550 is removed, e.g., by polishing. The portion of the metal 550 may be the portion that is above the layer 505. The layer 505 may be slightly polished or not polished at all. After the polishing processing, the vias 560A-560C are formed. One end of each of the vias 560A-560C is connected to one of the multilayer metal lines 510A-510C. The other end of each of the vias 560A-560C may be connected to another metal layer. Even though not shown in FIG. 5E, the multilayer metal lines 510A-510C may also be connected with vias beneath the metal layer 500. The vias beneath the metal layer 500 may be connected to another metal layer or to one or more semiconductor devices, e.g., semiconductor devices arranged in a FEOL section (e.g., the FEOL section 110 in FIG. 1).

Figures 6A, 6B:
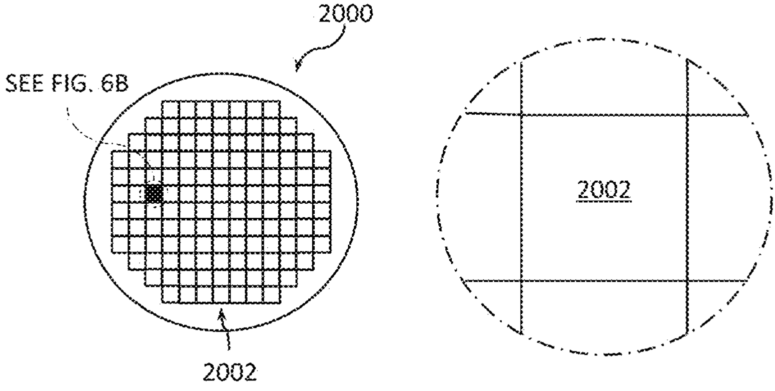
FIGS. 6A-6B are top views of a wafer and dies that may include one or more varactor devices with backside electrical contact, according to some embodiments of the disclosure.

FIGS. 6A-6B are top views of a wafer 2000 and dies 2002 that may include one or more varactor devices with backside electrical contact, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 7. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more varactor devices as described herein). After the fabrication of the semiconductor product is complete (e.g., after manufacture of one or more varactor devices as described herein), the wafer 2000 may undergo a singulation process in which each of the dies 2002 is separated from one another to provide discrete "chips" of the semiconductor product. In particular, devices that include one or more varactor devices as disclosed herein may take the form of the wafer 2000 (e.g., not singulated) or the form of the die 2002 (e.g., singulated). The die 2002 may include one or more diodes (e.g., one or more varactor devices as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, a radio frequency front-end device, a memory device (e.g., a static random-access memory (SRAM) device), a logic device (e.g., an AND, OR, NAND, or NOR gate), or any other suitable circuit element. Multiple ones of these devices may be combined on a single die 2002.

Figure 7:
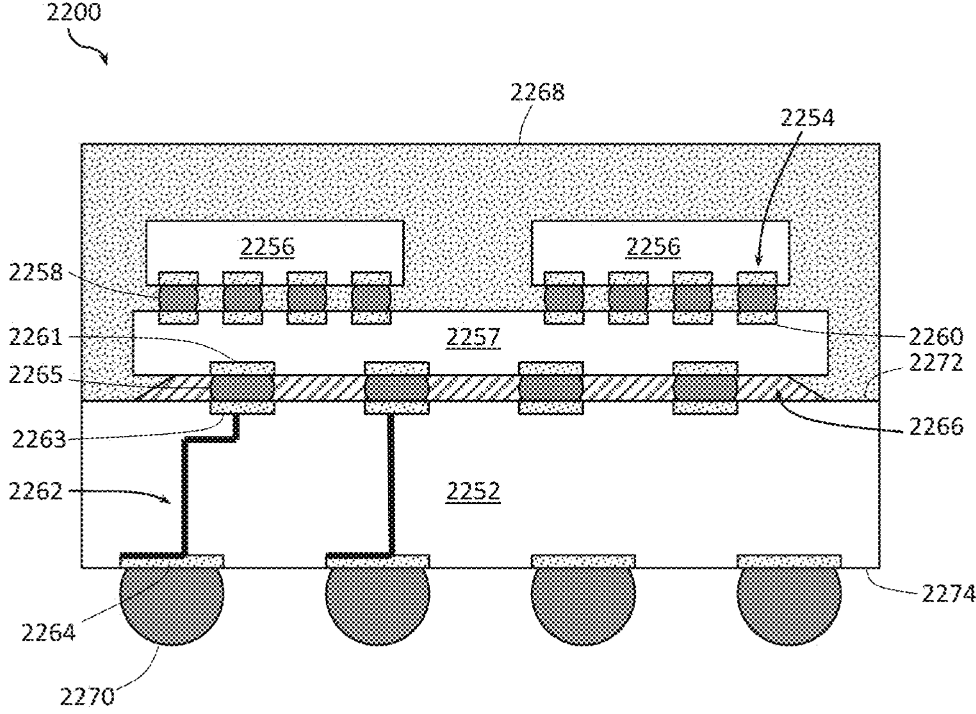
FIG. 7 is a side, cross-sectional view of an example IC package that may include one or more IC devices having varactor devices with backside electrical contact, according to some embodiments of the disclosure.

FIG. 7 is a side, cross-sectional view of an example IC package 2200 that may include one or more IC devices having varactor devices with backside electrical contact, according to some embodiments of the disclosure. In some embodiments, the IC package 2200 may be a system-in-package (SiP).

As shown in FIG. 7, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 7 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 7 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 7 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 8.

The dies 2256 may take the form of any of the embodiments of the die 2002 discussed herein and may include any of the embodiments of an IC device having one or more varactor devices. In embodiments in which the IC package 2200 includes multiple dies 2256, the IC package 2200 may be referred to as a multi-chip package. Importantly, even in such embodiments of an MCP implementation of the IC package 2200, one or more varactor devices may be provided in a single chip, in accordance with any of the embodiments described herein. The dies 2256 may include circuitry to perform any desired functionality. For example, one or more of the dies 2256 may be ESD protection dies, including one or more varactor devices as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more varactor devices, e.g., as discussed above; in some embodiments, at least some of the dies 2256 may not include any III-N diodes with n-doped wells and capping layers.

The IC package 2200 illustrated in FIG. 7 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 7, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 8:
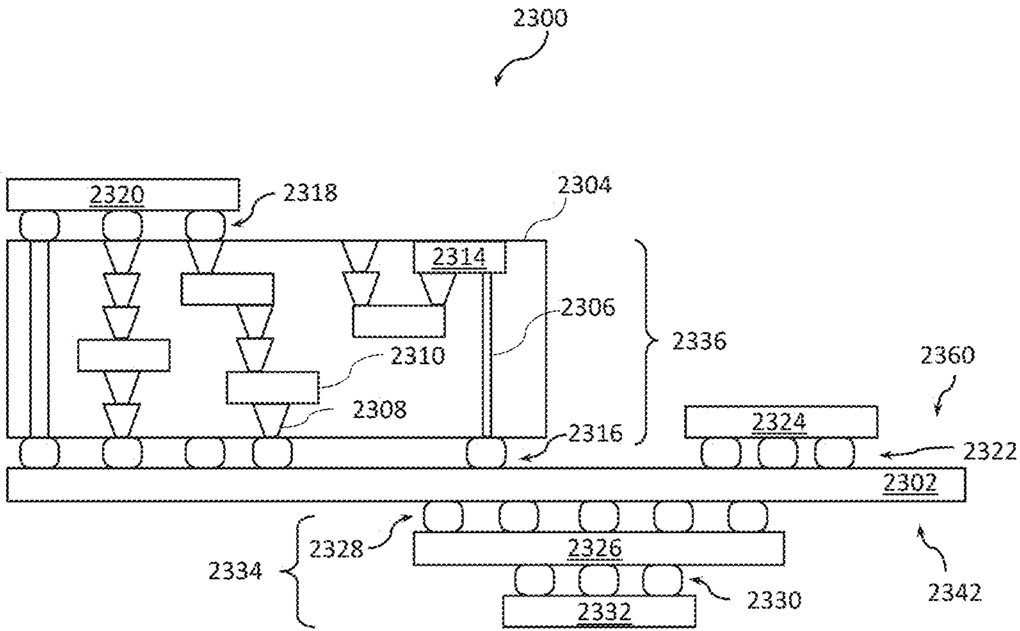
FIG. 8 is a cross-sectional side view of an IC device assembly that may include components having one or more IC devices implementing varactor devices with backside electrical contact, according to some embodiments of the disclosure.

FIG. 8 is a cross-sectional side view of an IC device assembly 2300 that may include components having one or more IC devices implementing varactor devices with backside electrical contact, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more varactor devices in accordance with any of the embodiments disclosed herein; e.g., any of the IC packages discussed below with reference to the IC device assembly 2300 may take the form of any of the embodiments of the IC package 2200 discussed above with reference to FIG. 7 (e.g., may include one or more varactor devices in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 8 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 8), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device of FIGS. 1-2), or any other suitable component. In particular, the IC package 2320 may include one or more varactor devices as described herein. Although a single IC package 2320 is shown in FIG. 8, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 8, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more varactor devices as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 8 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 9:
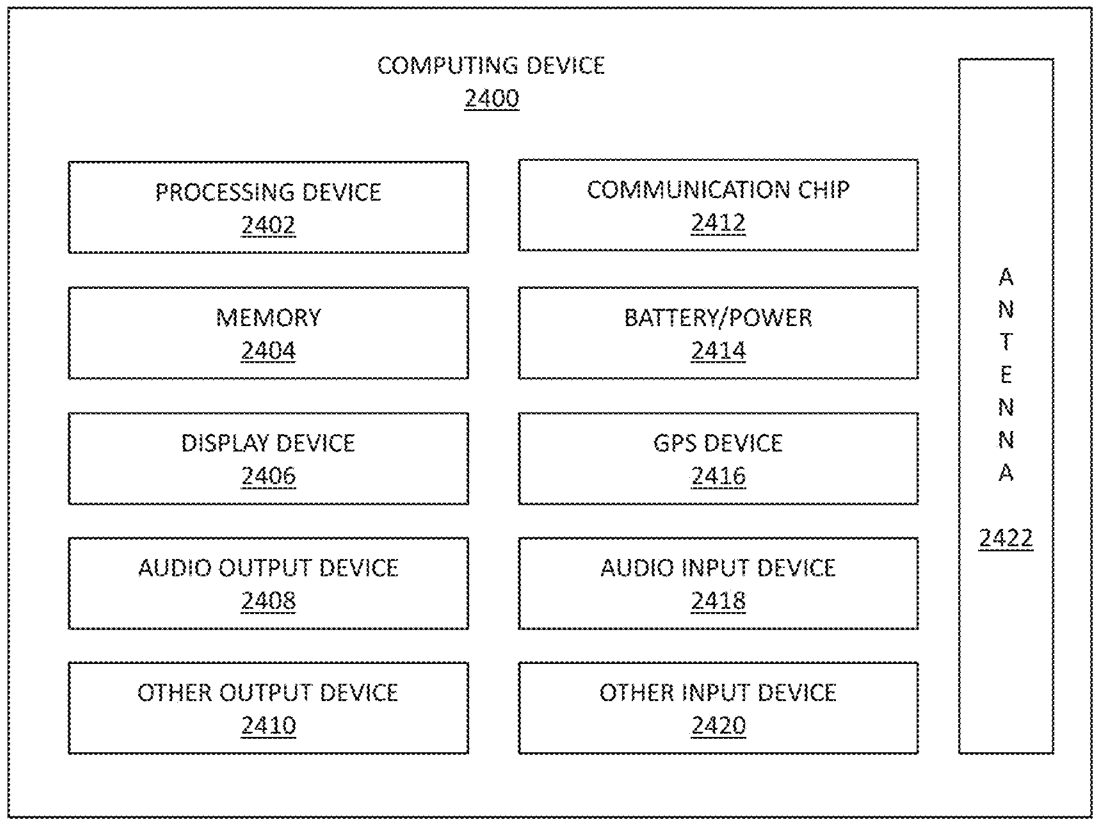
FIG. 9 is a block diagram of an example computing device that may include one or more components with varactor devices with backside electrical contact, according to some embodiments of the disclosure.

FIG. 9 is a block diagram of an example computing device 2400 that may include one or more components with one or more IC devices having one or more varactor devices, according to some embodiments of the disclosure. For example, any suitable ones of the components of the computing device 2400 may include a die (e.g., the die 2002 of FIG. 6B) including one or more varactor devices, according to some embodiments of the disclosure. Any of the components of the computing device 2400 may include a varactor device (e.g., any embodiment of the varactors devices of FIGS. 1 and 2-10) and/or an IC package (e.g., the IC package 2200 of FIG. 7). Any of the components of the computing device 2400 may include an IC device assembly (e.g., the IC device assembly 2300 of FIG. 8).

A number of components are illustrated in FIG. 9 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC (system-on-chip) die.

Additionally, in various embodiments, the computing device 2400 may not include one or more of the components illustrated in FIG. 9, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more varactor devices as described herein may be particularly advantageous for use as part of ESD circuits protecting power amplifiers, low-noise amplifiers, filters (including arrays of filters and filter banks), switches, or other active components. In some embodiments, IC devices having one or more varactor devices as described herein may be used in PMICs, e.g., as a rectifying diode for large currents. In some embodiments, IC devices having one or more varactor devices as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device, including a first structure including a first layer, a second layer, and a third layer, where the first layer is between the second layer and the third layer in a first direction, the first layer includes a first metal, and the second layer or the third layer includes a second metal that is different from the first metal; a second structure at least partially wrapping around the first structure; and a third structure including an electrical insulator, where a portion of the second structure is between the first structure and the third structure in a second direction, a height of the second structure in the first direction is at least equal to a height of the first layer in the first direction, and the second direction is orthogonal to the first direction.

Example 2 provides the IC device according to example 1, where the first structure further includes a fourth layer, at least a portion of the second layer is between the fourth layer and the first layer in the first direction, and the fourth layer includes a dielectric material.

Example 3 provides the IC device according to example 2, where a height of the fourth layer in the first direction is between about 5 and 20 nanometers.

Example 4 provides the IC device according to example 2 or 3, where a width of the second layer in the second direction is smaller than a width of the third layer in the second direction.

Example 5 provides the IC device according to any one of examples 2-4, where the third layer is connected to a via, the via is connected to a terminal of a semiconductor device.

Example 6 provides the IC device according to any one of examples 2-5, where another portion of the second layer is connected to a via, the via is connected to a fourth structure, and the fourth structure includes one or more metal layers.

Example 7 provides the IC device according to any of the preceding examples, where a height of the first layer in the first direction is between about 15 and 40 nanometers.

Example 8 provides the IC device according to any of the preceding examples, where a width of the first layer in the second direction is not greater than 15 nanometers.

Example 9 provides the IC device according to any of the preceding examples, where a height of the second layer or the third layer in the first direction is between about 2 and 5 nanometers.

Example 10 provides the IC device according to any of the preceding examples, where the first metal includes aluminum.

Example 11 provides an IC device, including a first layer including a first metal; a second layer including a second metal, where the second layer includes a first portion and a second portion; a third layer including a third metal; a fourth layer including a dielectric material, where the fourth layer is over the first portion of the second layer; and a via over the second portion of the second layer, where the first layer is between the second layer and the third layer, and the first metal is different from the second metal or the third metal.

Example 12 provides the IC device according to example 11, further including a fifth layer, the fifth layer wrapping around at least part of a combination of the first layer, the second layer, and the third layer.

Example 13 provides the IC device according to example 11 or 12, where the first layer is between the second layer and the third layer in a first direction, and a width of the second layer in a second direction orthogonal to the first direction is smaller than a width of the third layer in the second direction.

Example 14 provides the IC device according to any one of examples 11-13, where a distance between the second layer and the third layer is between about 15 and 40 nanometers.

Example 15 provides the IC device according to any one of examples 11-14, where the third layer is connected to an additional via, the additional via is connected to a terminal of a semiconductor device.

Example 16 provides a method for forming an IC device, including forming a first layer between a second layer and a third layer, where the first layer includes a first metal, and the second or third layer includes a second metal; forming a fourth layer over the second layer, where the fourth layer includes a dielectric material; after forming the fourth layer, forming an opening through the first layer, the second layer, the third layer, and the fourth layer; forming a fifth layer in the opening, wherein the fifth layer at least partially wraps around the first layer; and after forming the fifth layer, providing an electrical insulator to the opening.

Example 17 provides the method according to example 16, where forming the first layer between the second layer and the third layer includes forming the first layer between the second layer and the third layer at a pressure that is between about $10^{-9}$ to $10^{-6}$ Torr.

Example 18 provides the method according to example 16 or 17, further including forming a fifth layer over the fourth layer, where the fifth layer includes another dielectric material; forming a first opening by removing a portion of the fifth layer through a first etch; forming a second opening by removing a portion of the fourth layer through a second etch, where the first opening is over the second opening; and providing a metal to the first opening and the second opening.

Example 19 provides the method according to any one of examples 16-18, where a distance between the second layer and the third layer is between about 15 and 40 nanometers.

Example 20 provides the method according to any one of examples 16-19, where the first metal is aluminum.

Example 21 provides an IC package, including the IC device according to any one of examples 1-15; and a further IC component, coupled to the device.

Example 22 provides the IC package according to example 21, where the further IC component includes one of a package substrate, an interposer, or a further IC die.

Example 23 provides the IC package according to example 21 or 22, where the IC device according to any one of examples 1-15 may include, or be a part of, at least one of a memory device, a computing device, a wearable device, a handheld electronic device, and a wireless communications device.

Example 24 provides an electronic device, including a carrier substrate; and one or more of the IC devices according to any one of examples 1-15 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 16-20, further including processes for forming the IC device according to any one of examples 1-15.

Example 35 provides the method according to any one of examples 16-20, further including processes for forming the IC package according to any one of the examples 21-23.

Example 36 provides the method according to any one of examples 15-20, further including processes for forming the electronic device according to any one of the examples 24-3 The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

a first structure comprising a first layer, a second layer, and a third layer, wherein the first layer is between the second layer and the third layer in a first direction, the first layer comprises a first metal, and the second layer or the third layer comprises a second metal that is different from the first metal; and a second structure at least partially wrapping around the first structure;

a third structure comprising an electrical insulator;

a fourth structure comprising another electrical insulator, wherein at least part of the fourth structure is over the third structure in the first direction; and a fifth structure comprising a metal, wherein a first portion of the fifth structure is at least partially wrapped around by the fourth structure and another portion of the fifth structure is at least partially wrapped around by the third structure, wherein a portion of the second structure is between the first structure and the third structure in a second direction, a height of the second structure in the first direction is at least equal to a height of the first layer in the first direction, and the second direction is orthogonal to the first direction.

2. The IC device according to claim 1, wherein the first structure further comprises a fourth layer, at least a portion of the second layer is between the fourth layer and the first layer in the first direction, and the fourth layer comprises a dielectric material or a conductive material.

3. The IC device according to claim 2, wherein a height of the fourth layer in the first direction is between about 5 and 20 nanometers.

4. The IC device according to claim 2, wherein a width of the second layer in the second direction is smaller than a width of the third layer in the second direction.

5. The IC device according to claim 2, wherein the third layer is connected to a via, and the via is connected to a terminal of a semiconductor device.

6. The IC device according to claim 2, wherein another portion of the second layer is connected to a via, the via is connected to a fourth structure, and the fourth structure comprises one or more metal layers.

7. The IC device according to claim 1, wherein a height of the first layer in the first direction is between about 15 and 40 nanometers.

8. The IC device according to claim 1, wherein a width of the first layer in the second direction is not greater than 15 nanometers.

9. The IC device according to claim 1, wherein a height of the second layer or the third layer in the first direction is between about 2 and 5 nanometers.

10. The IC device according to claim 1, wherein the first metal includes aluminum.

11. An integrated circuit (IC) device, comprising:

a first layer comprising a first metal;

a second layer comprising a second metal, wherein the second layer comprises a first portion and a second portion;

a third layer comprising a third metal;

a fourth layer comprising a dielectric material, wherein the fourth layer is over the first portion of the second layer;

a fifth layer comprising another dielectric material, wherein at least part of the fifth layer is over the fourth layer;

a via over the second portion of the second layer, the via comprising a metal, wherein the first layer is between the second layer and the third layer, wherein the first metal is different from the second metal or the third metal, and wherein a portion of the via is at least partially wrapped around by the fourth layer and another portion of the via is at least partially wrapped around by the fifth layer.

12. The IC device according to claim 11, further comprising:

a sixth layer, the sixth layer wrapping around at least part of a combination of the first layer, the second layer, and the third layer.

13. The IC device according to claim 11, wherein the first layer is between the second layer and the third layer in a first direction, and a width of the second layer in a second direction orthogonal to the first direction is smaller than a width of the third layer in the second direction.

14. The IC device according to claim 11, wherein a distance between the second layer and the third layer is between about 15 and 40 nanometers.

15. The IC device according to claim 11, wherein the third layer is connected to an additional via, the additional via is connected to a terminal of a semiconductor device.

16. A method for forming an integrated circuit (IC) device, comprising:

forming a first layer between a second layer and a third layer, wherein the first layer comprises a first metal, and the second or third layer comprises a second metal;

forming a fourth layer over the second layer, wherein the fourth layer comprises a dielectric material;

after forming the fourth layer, forming an opening through the first layer, the second layer, the third layer, and the fourth layer;

forming a fifth layer in the opening, wherein the fifth layer at least partially wraps around the first layer;

after forming the fifth layer, providing an electrical insulator to the opening;

forming a sixth layer over the fourth layer, wherein the sixth layer comprises another dielectric material;

forming a first opening by removing a portion of the sixth layer through a first etch;

forming a second opening by removing a portion of the fourth layer through a second etch, wherein the first opening is over the second opening; and providing a metal to the first opening and the second opening.

17. The method according to claim 16, wherein forming the first layer between the second layer and the third layer comprises:

forming the first layer between the second layer and the third layer at a pressure that is between about $10^{-9}$ to $10^{-6}$ Torr.

18. The method according to claim 16, wherein a distance between the second layer and the third layer is between about 15 and 40 nanometers.

19. The method according to claim 16, wherein the first metal is aluminum.

* * * * *